(12) United States Patent
Howard et al.

(10) Patent No.: US 7,378,664 B1
(45) Date of Patent: May 27, 2008

(54) DEICING OF RADIATION DETECTORS IN ANALYTICAL INSTRUMENTS

(75) Inventors: James V. Howard, Madison, WI (US); Tom Jacobs, Madison, WI (US); Mark E. Misenheimer, Middleton, WI (US); David B. Rohde, Madison, WI (US); Bruce R. Weber, Waunakee, WI (US)

(73) Assignee: Thermo Electron Scientific Instruments LLC, Madison, WI (US)

( * ) Notice: Subject to any disclaimer, the term of this patent is extended or adjusted under 35 U.S.C. 154(b) by 83 days.

(21) Appl. No.: 11/432,909

(22) Filed: May 12, 2006

(51) Int. Cl.
*G01T 1/24* (2006.01)
*G01T 1/40* (2006.01)
(52) U.S. Cl. ............. 250/370.15; 250/311; 250/370.09
(58) Field of Classification Search ........... 250/370.09, 250/370.15; 62/50.7; 361/676
See application file for complete search history.

(56) References Cited

U.S. PATENT DOCUMENTS

| | | | |
|---|---|---|---|
| 3,919,553 A * | 11/1975 | Cohen et al. ............... | 250/310 |
| 4,834,394 A | 5/1989 | Katz et al. | |
| 4,931,650 A * | 6/1990 | Lowe et al. ................ | 250/397 |
| 5,075,555 A * | 12/1991 | Woldseth et al. ...... | 250/370.15 |
| 5,081,358 A * | 1/1992 | Yoshikawa ............... | 250/338.3 |
| 5,274,237 A * | 12/1993 | Gallagher et al. ..... | 250/370.15 |
| 5,588,999 A | 12/1996 | Takahashi | |
| 5,811,816 A * | 9/1998 | Gallagher et al. ..... | 250/370.15 |

* cited by examiner

*Primary Examiner*—Davd P. Porta
*Assistant Examiner*—Casey Bryant
(74) *Attorney, Agent, or Firm*—DeWitt Ross & Stevens; Michael C. Staggs

(57) ABSTRACT

In an analytical instrument having a radiation detector, such as an electron microscope with an X-ray detector, a thermoelectric element (such as one or more Peltier junctions) is driven by a cooling power supply to cool the detector and thereby decrease measurement noise. Oil condensates and ice can then form on the detector owing to residual water vapor and vacuum pump oil in the analysis chamber, and these contaminants can interfere with measurement accuracy. To assist in reducing this problem, the thermoelectric element can be powered in the reverse of its cooling mode, thereby heating the detector and evaporating the contaminants. After the detector is cleared of contaminants, it may again be cooled and measurements may resume. Preferably, the thermoelectric element is heated by a power supply separate from the one that provides the cooling power, though it can also be possible to utilize a single power supply to provide both heating and cooling modes.

5 Claims, 1 Drawing Sheet

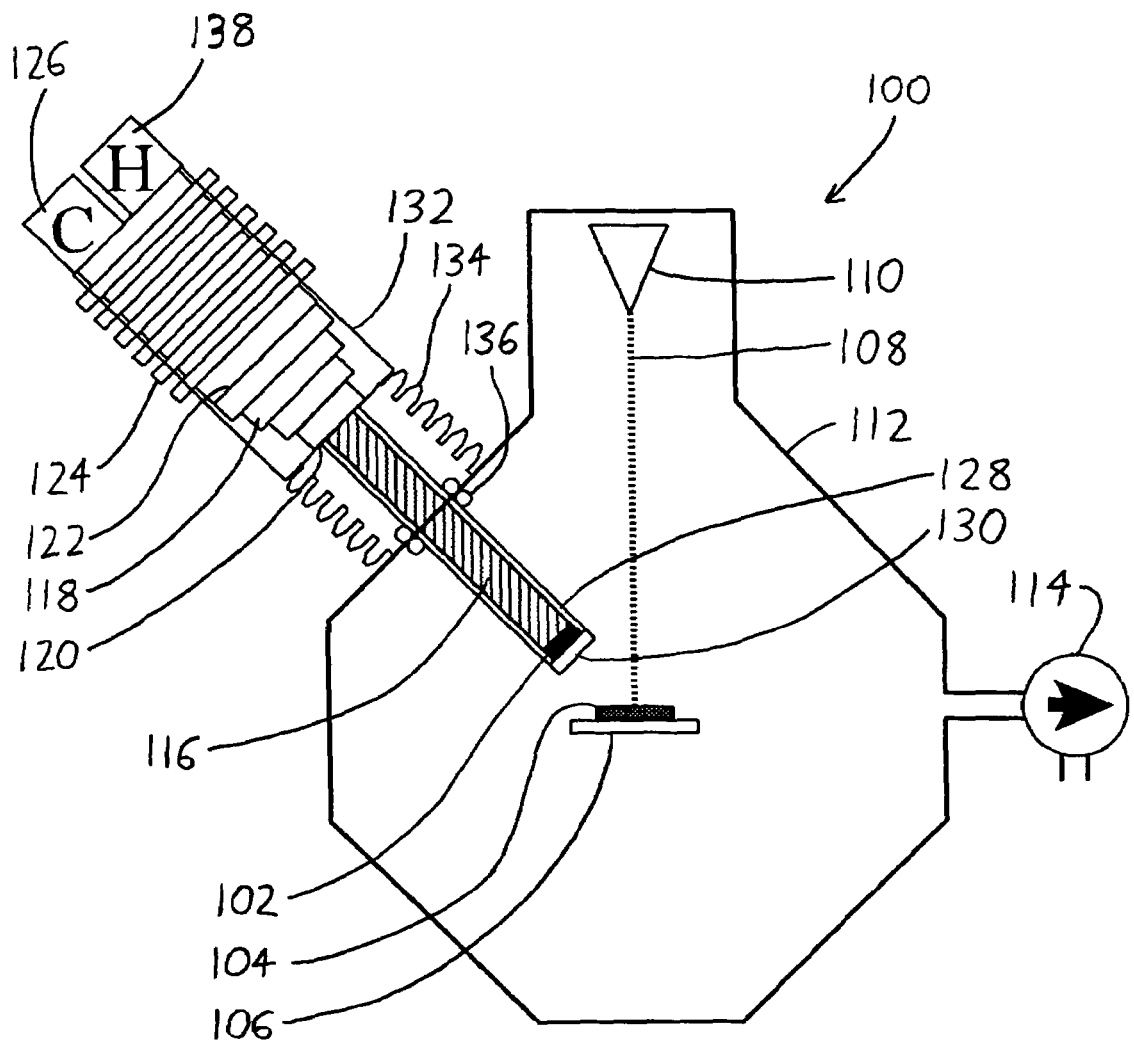
The Figure

DEICING OF RADIATION DETECTORS IN ANALYTICAL INSTRUMENTS

FIELD OF THE INVENTION

This document concerns an invention relating generally to inhibiting or preventing ice formation on cooled (e.g., cryogenically chilled) sensors present in analytical instruments, and more specifically to ice prevention/removal on cooled radiation detectors such as those found in electron microscopes.

BACKGROUND OF THE INVENTION

Various instruments for analyzing the characteristics of materials rely on sensors for at least a portion of their measurement operations, with these sensors being chilled to low temperatures to enhance measurement accuracy (e.g., by decreasing electronic "noise"). As an example, electron microscopes often include an X-ray detector (such as a silicon sensor) mounted at the end of an elongated probe or other mount, often called a "cold finger," which is situated next to a specimen to be analyzed. The cold finger is chilled to cryogenic (ultralow) temperatures, usually by a Dewar system utilizing liquid nitrogen coolant, though some systems use a standard refrigeration cycle for cooling (i.e., evaporative cooling). Additionally, one provider (Thermo Electron, Madison, Wis., USA) has long provided thermoelectric (Peltier) cooling of detectors. During operation, as the specimen is bombarded by electrons from the microscope's electron beam, it emits X-rays which are picked up by the detector. The detector measurements can be processed to provide information regarding the specimen's material and other characteristics.

These arrangements suffer from the unfortunate disadvantage that while cooling of the detector enhances measurement quality, cooling also increases the possibility that the detector will be fouled (and its measurements skewed) owing to water/oil condensation, and ice formation, on the cooled detector. Moisture and oil are often present in the analysis chamber wherein the specimen and detector are located, with the oil originating from the vacuum pumping system. While they can be diminished by steps such as evacuating the analysis chamber so the specimen and detector are in vacuum (a common step), ice and oil condensates still tend to collect on the detector owing to factors such as residual gas within the analysis chamber and moisture release from the specimen. Some detectors and mounts are partially insulated from the analysis chamber by a surrounding shell about the mount and/or a window between the chamber and the detector; however, even these arrangements tend to accumulate ice and oil on the shell and/or window. Additionally, while windows help protect detectors from contamination, they can also block lower-energy emissions that could otherwise be usefully detected by the detector.

As discussed in U.S. Pat. Nos. 4,931,650 and 5,274,237, the foregoing difficulties have led to the development of a variety of corrective devices and methodologies. Both patents describe the use of periodic warm-up cycles wherein the mount and detector are allowed to warm up to drive off water. U.S. Pat. No. 4,931,650 assists such a procedure by incorporating a resistive heater for warming the detector, and U.S. Pat. No. 5,274,237 has a portion of the analysis chamber about the detector at a cooler temperature so that the bulk of any ice will form away from the detector. However, it would be useful to have further arrangements available for avoiding detector ice contamination in electron microscopes and other analytical instruments.

SUMMARY OF THE INVENTION

The invention involves arrangements which are intended to at least partially address the aforementioned problems. A brief summary of an exemplary version of the invention follows below in order to give the reader a basic understanding of some of its advantageous features, with reference being made to the accompanying drawing, which schematically depicts the exemplary version. Since this is merely a summary, it should be understood that more details regarding preferred versions of the invention may be found in the Detailed Description set forth elsewhere in this document. The claims set forth at the end of this document then define the various versions of the invention in which exclusive rights are secured.

The invention is primarily intended for implementation in an analytical instrument 100 having a radiation detector 102, such as the electron microscope schematically depicted in the accompanying FIGURE. In the electron microscope 100, a specimen 104 on a sample stage 106 is subjected to an electron beam 108 from an electron beam source 110, and a radiation detector 102 (here an X-ray detector) receives radiation emitted from the specimen 104 to provide information regarding the characteristics of the specimen 104. The foregoing components are situated within an analysis chamber 112, which is evacuated by means of a vacuum pump 114.

The radiation detector 102 is coupled to a thermally conductive mount 116 (e.g., a "cold finger" made of copper and/or another conductive metal), which is shown as being slidably connected to the analysis chamber 112 to allow the radiation detector 102 to be advanced or retracted to a desired position relative to the sample stage 106. The mount 116 is then coupled to a thermoelectric element 118 such as one or more Peltier junctions, with a multi-element "stack" being depicted in the FIGURE. The thermoelectric element(s) 118 have a cold side 120 adjacent the mount 116 and detector 102 and an opposing hot side 122. A heat sink 124, here shown as a series of fins, is coupled to the hot side 122 of the thermoelectric element(s) 118 to allow cooling of the mount 116 when the element(s) 118 are supplied with power from a cooling power supply 126. To deter ice formation and/or oil condensation on the mount 116 and detector 102, the detector 102 may be isolated from the chamber interior by a shell 128 surrounding the mount 116, and by a window 130 situated on the shell 128 between the sample stage 106 and the detector 102. In addition, a housing 132 about the element(s) 118 is joined to the chamber 112 via a bellows 134 which helps prevent air from leaking into the chamber 112, with such leakage also being deterred by a seal 136 in the walls of the chamber 112 about the mount 116 or about the shell 128 surrounding the mount 116).

In operation, the analysis chamber 112 is at least substantially evacuated by the vacuum pump 114, and current is supplied to the thermoelectric element(s) 118 by the cooling power supply 126 to decrease the temperature of the mount 116 and the radiation detector 102 to an operating temperature. The electron beam source 110 is then activated, and the radiation detector 102 is used to take measurements from the specimen 104. If the mount 116 and detector 102 are maintained at low temperatures for an extended period of time (as they often are), oil condensates and/or ice can form on the detector 102 (or on the adjacent window 130, if present), and thereby interfere with measurements. To reduce or eliminate this problem, another power supply 138—one configured to increase the temperature of the mount 116 and the radiation detector 102 to a conditioning temperature sufficient to melt ice, and evaporate oil/water condensates—can be provided in connection with the thermoelectric element(s) 118 to heat them when desired. (It is also possible to simply have a single power supply which is reversible so as to provide both cooling and heating functions, but since control and reversibility is expensive to achieve with readily available power supplies, it is generally less expensive to simply utilize separate power supplies for heating and cooling of the same element(s) 118.) The heating power supply 138 can maintain the temperature of the radiation detector 102 at or about the conditioning temperature for a discrete conditioning period sufficient to drive off water and oil, and can then be turned off. The cooling power supply 126 can then be reactivated to supply suitable current to the thermoelectric element(s) 118 to return the radiation detector 102 to a temperature at or about the operating temperature, at which point the radiation detector 102 may resume taking measurements. (It is recommended that the detector 102 only take measurements when at the operating temperature, and that it not take measurements during the conditioning period, since the heated detector 102 may exhibit substantial measurement noise.)

Beneficially, since the thermoelectric element(s) 118 can actively heat the mount 116 and detector 102—that is, they can raise the temperature of the detector 102 to a conditioning temperature above the ambient temperature (as measured outside the analysis chamber 112), rather than simply turning off so that the mount 116 and detector 102 slowly warm from their operating temperature to the ambient temperature—reconditioning of the detector 102 (i.e., removal of oil and water/ice) can be very quickly performed with conditioning periods of 15 minutes or less. This is a significant advantage in comparison to prior arrangements wherein reconditioning simply occurred by removing the cooling source (e.g., by terminating the supply of liquid nitrogen or other refrigerant), and hours were required for the detector 102 to slowly return to ambient temperature and for water/oil to evaporate off the detector 102.

Further advantages, features, and objects of the invention will be apparent from the remainder of this document in conjunction with the associated drawings.

BRIEF DESCRIPTION OF THE DRAWINGS

FIG. 1 is a schematic view of an exemplary preferred version of the invention, showing a radiation detector 102 situated at the end of a mount or "cold finger" 116 opposite a specimen 104 (which receives an electron beam 108 from an electron source 110), and wherein a stack of thermoelectric elements 118 can cool the mount 116 (and thus the detector 102) to an operating temperature via a cooling power supply 126 so that the detector 102 may take measurements from the specimen 104, and/or heat the mount 116 and detector 102 to a conditioning temperature via a heating power supply 138 to remove water/ice and oil condensates from the detector 102.

DETAILED DESCRIPTION OF PREFERRED VERSIONS OF THE INVENTION

The analytical instrument 100 depicted in the FIGURE can be readily constructed from existing electron microscopes, with examples being the FEI (Hillsboro, Oreg., USA) Nova, Quanta, Altura, Expida, Strata, Tecnai, and Titan series electron microscopes, Carl Zeiss SMT (Thornwood, N.Y., USA) Supra, Ultra, Libra, and CrossBeam series electron microscopes, Hitachi (Pleasanton, Calif., USA) S and H series electron microscopes, and JEOL (Tokyo, JP) JSM series electron microscopes. However, since the instrument 100 is merely an exemplary preferred version of the invention, it should be kept in mind that the invention, as claimed below, can assume a variety of forms which drastically vary from the one shown in the FIGURE. As examples, the vacuum chamber 112 may be shaped differently, the analytical instrument may be other than an electron microscope 100 (and thus the electron beam source 110 may not be present), and the radiation detector 102 may measure electromagnetic radiation in wavelength ranges other than or in addition to X-rays (for example, in the infrared range). The mount 116 may have a configuration other than as an elongated "cold finger," and while the mount 116 shown in the FIGURE is translatably mounted to the analysis chamber 112 with respect to the sample stage 106 via an O-ring or other seal 136, the mount 116 could instead be stationary, or could be made movable within the chamber 112 by other arrangements. In addition, the nature, configuration, and layout of the thermoelectric element(s) 118, the cooling and heating power supplies 126 and 138, and the heat sink 124 may vary widely, since such components are available in a broad range of different configurations.

As previously noted, the shell 128 and window 130, which serve to isolate the mount 116 and detector 102 from the analysis chamber 112 (and thus from condensation of water and oil from the chamber 112 onto the detector 102), need not be present. If they are present, in which case condensation and icing may occur on the shell 128 and window 130 rather than on the mount 116 and detector 102, the shell 128 might be conductively coupled to the thermoelectric element(s) 118 so that the shell 128 and window 130 can be efficiently heated. Alternatively, the shell 128 could be coupled to a separate set of one or more thermoelectric elements (and to a heating power supply), one not shown in the FIGURE, so that it can be heated independently of any cooling of the mount 116 and detector 102.

In similar respects, one or more thermoelectric elements 118 (and a cooling power supply 126), and/or some other form of cooling means, could be situated in the analysis chamber 112 at a location spaced away from the mount 116 and detector 102, and these could be activated when the mount 116 and detector 102 are warmed to the conditioning temperature. In this manner, water and oil that have condensed on the mount 116 and detector 102 can be driven off and collected on the separate thermoelectric elements (and/or other cooling means). Other arrangements, such as those noted in the prior patents listed at the outset of this document, could also or alternatively be used.

The use of a heating power supply 138 in conjunction with thermoelectric heating elements is not limited to situations where thermoelectric cooling is used. Thus, thermoelectric elements 118 could be used to heat a detector 102 to a conditioning temperature in cases where conventional liquid nitrogen or other cryogenic cooling systems are used.

Preferred versions of the invention have been described above in order to illustrate how to make and use the invention. The invention is not intended to be limited to these versions, but rather is intended to be limited only by the claims set out below. Thus, the invention encompasses all different versions that fall literally or equivalently within the scope of these claims.

What is claimed is:

1. A method of operating an analytical instrument which includes:
   (1) an analysis chamber,
   (2) a radiation detector coupled to a heat-conductive mount within the analysis chamber, and
   (3) a thermoelectric element coupled to the mount, the method including the steps of:
   a. at least substantially evacuating gas from the analysis chamber;
   b. supplying current to the thermoelectric element suitable to decrease the temperature of the radiation detector to an operating temperature;
   c. subsequently supplying current to the thermoelectric element to increase the temperature of the radiation detector to a conditioning temperature which is above the operating temperature;
   d. maintaining the temperature of the radiation detector at or about the conditioning temperature for a discrete conditioning period; and
   e. supplying current to the thermoelectric element suitable to return the radiation detector to a temperature at or about the operating temperature.

2. The method of claim 1 wherein the conditioning temperature is above the ambient temperature as measured outside the analysis chamber.

3. The method of claim 1 wherein the conditioning period is less than or equal to 15 minutes.

4. The method of claim 1 further including the step of directing an electron beam into the analysis chamber when the radiation detector is at or about the operating temperature.

5. The method of claim 1 proceeded by the step of advancing the mount into the analysis chamber.

* * * * *